United States Patent [19]

Hoffarth et al.

[11] Patent Number: 4,918,574
[45] Date of Patent: Apr. 17, 1990

[54] MULTILAYER CIRCUIT BOARD WITH REDUCED SUSCEPTABILITY TO SHORTS CAUSED BY TRAPPED IMPURITIES

[75] Inventors: Joseph G. Hoffarth; Donald J. Lazzarini; John A. Welsh, all of Binghamton; John P. Wiley, Vestal, all of N.Y.

[73] Assignee: International Business Machines Corporation, Armonk, N.Y.

[21] Appl. No.: 183,491

[22] Filed: Apr. 15, 1988

Related U.S. Application Data

[63] Continuation-in-part of Ser. No. 95,089, Sep. 11, 1987, abandoned, which is a continuation of Ser. No. 922,422, Oct. 23, 1986, abandoned.

[51] Int. Cl.⁴ ............................................. H05K 1/11
[52] U.S. Cl. ..................................... 361/414; 361/397
[58] Field of Search ..................... 361/397, 412, 414

[56] References Cited

U.S. PATENT DOCUMENTS

| | | | |
|---|---|---|---|
| 3,509,624 | 5/1970 | Boucher | 361/414 X |
| 3,704,678 | 6/1973 | Hill | 361/414 X |
| 3,932,932 | 1/1976 | Goodman | 361/414 X |
| 4,591,220 | 5/1986 | Impey | 361/414 X |
| 4,606,787 | 8/1986 | Pelligrino | 156/632 |
| 4,789,423 | 12/1988 | Pelligrino | 156/631 |

Primary Examiner—Gregory N. Thompson
Attorney, Agent, or Firm—David A. Mims, Jr.; Manny W. Schecter; Maurice H. Klitzman

[57] ABSTRACT

A multilayer circuit board having a conformal layer of an insulating material separating a circuit core from an adjacent insulating layer is disclosed. The conformal layer encapsulates the substrate and conductive pattern of circuit lines in the circuit core, thereby reducing failures caused by impurities trapped during lamination. The multilayer circuit board is manufactured by coating at least one circuit core with the conformal layer of insulating material before final lamination of the circuit cores into a multilayer circuit board.

7 Claims, 1 Drawing Sheet

MULTILAYER CIRCUIT BOARD WITH REDUCED SUSCEPTABILITY TO SHORTS CAUSED BY TRAPPED IMPURITIES

This application is a continuation in part of application Ser. No. 95,089 filed on Sept. 11, 1987, now abandoned, which was a continuation of application Ser. No. 922,422 filed Oct. 23, 1986, now abandoned.

BACKGROUND OF THE INVENTION

1. Field of the Invention

The prsent invention relates to an improved multiplayer circuit board and a method of manufacture therefor. More particularly, the invention relates to a multiplayer circuit board having circuit cores coated with a conformal layer of insulating material to reduce the risk of failures caused by impurities trapped during lamination, and a method of manufacture therefor.

2. Description of the Related Art

Multilayer circuit boards are typically manufactured by first fabricating individual circuit cores, stacking the circuit cores in a parallel relationship with insulating layers between each pair of circuit cores, and then laminating the assembly together. A circuit core may be an insulating substrate having a conductive circuit pattern on one or both sides, or may be a single sheet of conductor having perforations therein to provide the circuit pattern. The circuit patterns are formed on the surface of an insulating substrate by selectively plating or selectively etching using a photoresist, which is removed after the circuit patterns are formed. The circuit patterns are formed on single sheets of conductor by drilling or punching holes in a unique pattern.

Critical defects in a multilayer circuit board may arise during lamination of the circuit cores. During lamination, material from the insulating layers flows into and fills the spaces between the conductive elements of the circuit patterns. The problems become particularly acute when the space between the conductive elements approaches or is less than 0.0055 inches. Impurities from the insulating layers and the environment can be trapped into the circuit board. The impurities are either particulates or surface contaminants. The particulates have been identified as cotton fibers, paper fiber and other unidentified contaminants and fibrous materials. The surface contaminants have been identified as various process chemicals and other unidentified contaminant. The most problematic impurities are those less than 0.003 inches in size. These impurities are known to later cause failures of the circuit board. The failures may be characterized as either intralevel or interlevel shorts resulting from impurities having insufficient dielectric properties. Intralevel shorts are those between circuit lines of the same circuit plane, or between circuit lines and plated thru holes interconnecting the circuit planes. Interlevel shorts are those between different circuit planes.

As the demand for improved circuit performance increases, the density of circuit lines in the conductive circuit pattern also increases. As the density of circuit lines increases, the average spacing between the circuit lines increases, the average spacing between the circuit lines decreases, thereby increasing the risk of failures caused by shorting. For example, high performance circuit board frequently have adjacent circuit line spacing approaching 0.0055 inches and circuit line to through hole spacing between 0.003 to 0.005 inches.

Thus, modern demand for improved circuit performance has resulted in the recognition of a need to reduce the risk of failures caused by impurities trapped during lamination.

One technique which reduces the risk of failures caused by impurities trapped during lamination involves the use of permanent photoresists. The layers of photoresist are not removed following the formation of the conductive circuit patterns of the circuit planes. Instead, the photoresist remains permanently on the substrates and in the final laminated structure. The presence of the permanent photoresist during lamination reduces the likelihood of impurities being trapped in the spaces between the circuit lines during lamination and thereby bridging adjacent circuit pattern elements. However, while permanent photoresists fill in the spaces between the circuit lines, the top or bottom surfaces of the circuit lines remain exposed and impurities trapped during lamination may still cause short circuits. In addition, multilayer circuit boards manufactured with permanent photoresists suffer from unique defects not related to the trapping of impurities during lamination. More particularly, the necessity of providing photosensitivity in a layer allowed to remain in the final structure of the circuit board increases material and processing costs, and may also degrade the mechanical and electrical properties of the material.

Another technique which reduces the risk of failures caused by impurities trapped during lamination involves fabricating the individual circuit cores by laminating together sheets of dielectric material and sheets of pre-punched conductive material. The sheets of dielectric material are sandwiched between separate sheets of the pre-punched conductive material. The conductive material is pre-punched according to the desired conductive circuit patterns. During lamination, the dielectric material flows into the holes punched in the conductive sheets to form a flush surface laminate circuit core. Several circuit cores are then finally laminated together with insulating layers therebetween, as in the usual manner. The absence of spaces between the circuit lines during lamination reduces the likelihood of impurities being trapped and thereby bridging adjacent circuit pattern elements. Again, however, the top or bottom surfaces of the circuit lines are exposed during final lamination. Thus, impurities trapped during final lamination may still cause short circuits.

SUMMARY OF THE INVENTION

In view of the foregoing, it is the principal object of this invention to improve multilayer circuit boards and methods of manufacture therefor when the spacing between the conductive elements approaches or is less than 0.0055 inches.

Another object of this invention is to reduce the risk of failures in a multilayer circuit board caused by impurities trapped dring lamination.

These and other objects of this invention are accomplished by a multilayer circuit board having circuit cores coated with a conformal layer of an insulating material. The conformal layers insulate the individual circuit elements from each other and from the impurities of the adjacent insulating layers and the environment. Hence, the likelihood of impurities bridging circuit elements when trapped during lamination is reduced. The multilayer circuit board is manufactured by coating the circuit cores with the conformal layers of insulating material before lamination of the circuit cores and insulating layers into a multilayer circuit board.

DESCRIPTION OF THE PREFERRED EMBODIMENT

Figure 1:
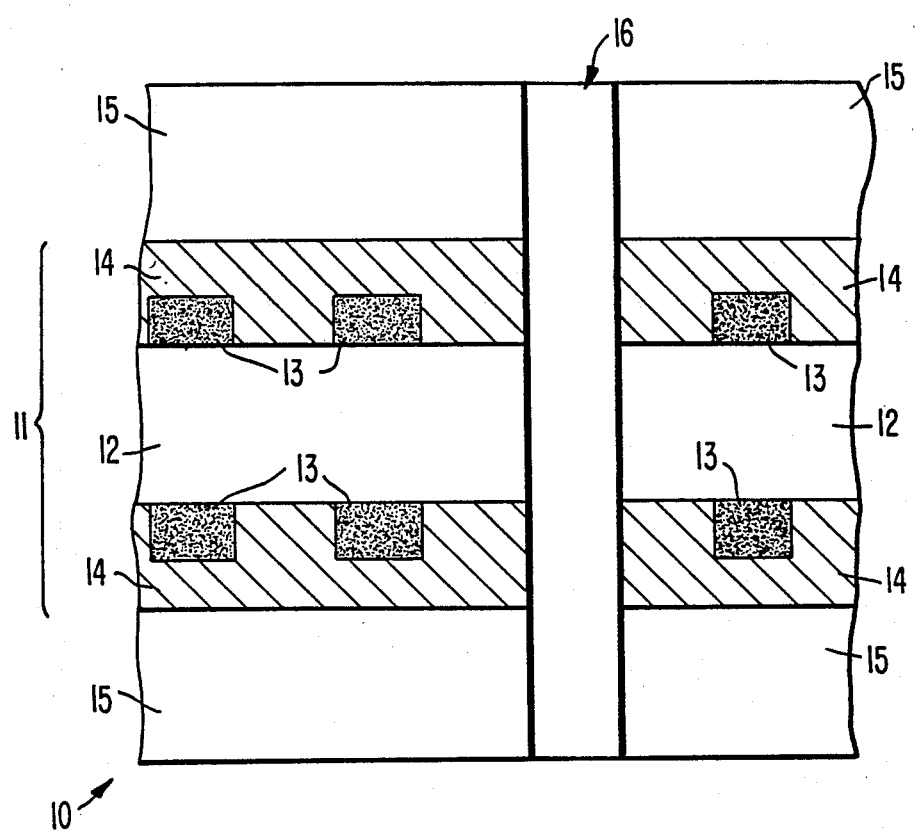
FIG. 1 is a cross-section of a portion of a multilayer circuit board of the invention.

Referring to FIG. 1, the structure of a portion 10 of a multilayer circuit board incorporating the invention will now be described. A conductive pattern of circuit lines 13 with nominal spacing of about 0.0055 inches reside on insulating substrate 12. Conformal layers 14 of insulating material encapsulate circuit lines 13 and substrate 12. Substrate 12, its associated conductive patterns of circuit lines 13, and conformal layers 14 comprise a single circuit core 11. Circuit core 11 may be either a power core or a signal core. Insulating layers 15 are adjacent to circuit core 11 and insulate it from adjacent circuit cores (not shown). Adjacent circuit cores refer to two circuit cores which would be in contact if not for the presence of the insulating layer therebetween. Plated thru hole 16 interconnects the circuit lines of different circuit cores. Conformal layers 14 prevent impurities from insulating layers 15 or from the environment from being trapped in the spaces between different circuit lines 13, or from being trapped in the spaces between a circuit line 13 and plated thru hole 16. The risk of impurities bridging different circuit lines 13, or bridging a circuit line 13 and plated thru hole 16 is thereby reduced. The reduction of the risk of failures caused by trapped impurities is further described below.

Method of Manufacture

The method of manufacturing a multilayer circuit board according to the invention will now be described. The multilayer circuit board is manufactured by first fabricating individual circuit cores, stacking the circuit cores in a parallel relationship with an insulating layer between each pair of circuit cores, and then laminating the assembly together. The final lamination of the assembly is hereinafter referred to simply as lamination of the circuit cores. The insulating layers serve to insulate the circuit cores from each other. During fabrication, the circuit planes are coated with conformal layers of insulating material to reduce failures caused by trapped impurities, as will be described using circuit core 11 of FIG. 1 as an example.

Insulating substrate 12 is initially provided without any circuit patterns on its exterior surfaces. Substrate 12 may be fabricatd from any suitable insulating material, such as glass fabric impregnated with partially cured epoxy resin, commonly known as pre-preg. Substrate 12 is then circuitized by any of several known processes to produce a conductive circuit pattern on the surfaces thereof. A variety of plating processes, photoresists, actinic radiation, developing processes, and etching processes can be used, as is known to one of ordinary skill in the art. The result will be a pattern of conductive circuit lines 13, made from a material such as copper, adhered to the surface of substrate 12 with a nominal spacings of about 0.0055 inches for the high performance circuit boards addressed by this invention.

A sample process for the circuitization of substrate 12 is commonly known as an "additive" process. According to the additive process, substrate 12 is first coated with photoresist (not shown in the drawing) and selectively exposed to actinic radiation through a mask. The photoresist is then developed by a chemical treatment to dissolve either the exposed or unexposed portions of the photoresist. The remaining portions of the photoresist define in the areas therebetween the eventual conductive pattern of circuit lines 13. A conductor is then blanket deposited to actually form circuit lines 13. The conductor may be any suitable material, such as copper. Copper may be deposited using conventional techniques such as electroless plating. After the conductor is deposited, the remaining photoresist is removed by further known chemical treatments. Spaces then remain in the areas between circuit lines 13 where the photoresist previously existed.

When circuit cores are laminated together to form a multilayer circuit board, impurities from the substrates or the environment may be trapped therebetween. Impurities trapped in the spaces between circuit lines may bridge conducting circuit elements, causing short circuits. These shorts may occur between adjacent circuit lines, between adjacent sides of a circuit core (i.e., between circuit planes), or between a circuit line and a plated thru hole particularly if the spacing approaches or is less than 0.003 inches. The effect of trapped impurities is reduced by coating the exposed surfaces of substrate 12 and circuit lines 13 with conformal layers 14 of insulating material before laminating circuit core 11 to insulating layers 15 and other circuit cores (not shown). Conformal layers 14 encapsulate circuit lines 13, leaving substantially no exposed surfaces, voids, or impurities therebetween. Thus, trapped impurities cannot bridge circuit elements together. Conventional methods of coating wherein the coatings are applied in a liquid state are inadequate because the liquids are drawn away from the edges of circuit lines 13 by surface tension, leaving circuit lines 13 exposed.

The solid insulating material can be chosen according to the electrical and mechanical properties required for a particular multiplayer circuit board. For example, the multilayer circuit board may require insulating materials having a low dielectric constant or a high glass transition temperature. Suitable insulating materials include polyimides or epoxies sufficiently adhere to substrate 12 and circuit lines 13, commonly available in partially cured sheets which are themselves coated with a polyester film. The sheets may be laminated to circuit core 11 using vacuum, roll, or press lamination. After lamination, the polyester film is peeled away.

The proper conditions for lamination vary according to the particular materials and equipment used. For example, epoxy films may be laminated to a circuit core having a pre-preg substrate and copper circuit lines using a solder mask vacuum laminator. The upper and lower chambers of the laminator are set at 55 degrees Celsius and a vacuum of less than 2.5 millimeters of mercury. The slap down time is set to 12 seconds and the dwell time in the chamber is set to 75 seconds. The approximately exit temperature of the circuit core surface is 60 degrees Celsius. The sheet is laminated to one side of a circuit core, excess sheet material is trimmed away, and the process is then repeated to coat the other side of the circuit core. An optional oven or UV light curing process may be used after lamination of the insulation material for further curing to improve the mechanical properties of the conformal layer. The need for further curing and the method by which it is accomplished are dependent on the materials employed and on the requirements of the specific application.

In the final lamination step, circuit core 11 is stacked upon other circuit planes with insulating layers 15 therebetween. The circuit cores are then press laminated to form a multilayer circuit board. Insulating layers 15 may be any insulating material compatible with the lamination process, including the same material as substrate 12, such as pre-preg. Plated thru hole 16 may then be fabricated in the conventional manner.

Other circuit cores in the same multilayer circuit board may be fabricated in a manner similar to that of sample circuit core 11. In such a case, each conformal layer of insulating material would insulate its respective circuit plane from the adjacent insulating layer. However, all circuit cores of a multilayer circuit board do not have to be coated with the conformal layer of insulating material for the circuit board to come within the scope of this invention. Circuit cores considered less susceptible to failures caused by the entrapment of impurities can be left uncoated. The susceptibility of a circuit core to failures caused by the entrapment of impurities can be determined by examining the topological features of each circuit core, such as the size of the spaces between circuit lines. By coating the circuit cores most susceptible to failures caused by the entrapment of impurities during lamination, related failures are significantly reduced.

While the invention has been described with respect to a preferred embodiment thereof, it will be understood by those skilled in the art that various changes in detail may be made therein without departing from the spirit, scope, and teaching of the invention. For example, FIG. 1 shows a circuit core in which both the top and bottom circuit planes are coated with a conformal layer of insulating material. However, one circuit plane of a circuit core may be left uncoated if it contains circuit lines relatively unsusceptible to failures caused by the entrapment of impurities. The spaces on an uncoated circuit plane are filled by the flow of the insulating layer, as previously described. Failures caused by the entrapment of impurities during final lamination will be significantly reduced. Accordingly, the invention herein disclosed is to be limited only as specified in the following claims.

What is claimed is:

1. A multilayer circuit board for use in applications where circuit lines and through holes have a high density rendering them susceptible to shorts caused by trapped impurities, comprising:
   a plurality of circuit cores, each of said circuit cores including a substrate of a first insulating material with a conductive pattern of circuit lines thereon and plated through holes therethrough and having one level of impurities;
   a conformal layer of a second insulating material encapsulating said circuit lines on at least one side of at least one of said circuit cores to eliminate said shorts caused by said trapped impurities, said second insulating material having a composition different from that of said first insulating material; and
   a third insulating material separating adjacent circuit cores from one another.

2. A multilayer circuit board, comprising:
   a plurality of circuit cores, each of said circuit cores including a substrate of a first insulating material with a conductive pattern of circuit lines thereon and plated through holes therethrough and having one level of impurities, said conductive pattern and said plated through holes having nominal spacing of no greater than 0.0055 inches;
   a conformal layer of a second insulating material encapsulating said circuit on at least one side of at least one of said circuit cores, said second insulating material having a composition different from that of said first insulating material; and
   a third insulating material separating adjacent circuit cores from one another.

3. The multilayer circuit board of claim 2, wherein said second insulating material consists essentially of epoxy.

4. The multilayer circuit board of claim 2, wherein said second insulating material consists essentially of polyimide.

5. The multilayer circuit board of claim 3, wherein said first insulating material consists essentially of pre-preg.

6. The multilayer circuit board of claim 4, wherein said first insulating material consists essentially of pre-preg.

7. The multilayer circuit board of claim 2, wherein an opposite side of said at least one of said circuit cores includes a conformal layer of a second insulating material.

* * * * *